United States Patent [19]
Minagawa et al.

[11] Patent Number: 5,754,442
[45] Date of Patent: May 19, 1998

[54] PATH ANALYZING DISPLAYING APPARATUS FOR DESIGNING LOGIC CIRCUIT

[75] Inventors: Eiji Minagawa; Hisashi Uraguchi, both of Kawasaki, Japan

[73] Assignee: Fujitsu Limited, Kawasaki, Japan

[21] Appl. No.: 505,964

[22] Filed: Jul. 24, 1995

[30] Foreign Application Priority Data

Nov. 17, 1994 [JP] Japan ................... 6-283823

[51] Int. Cl.⁶ ........................... G06F 17/50
[52] U.S. Cl. ........................ 364/489; 364/488
[58] Field of Search ..................... 364/488, 489, 364/578; 395/500

[56] References Cited

U.S. PATENT DOCUMENTS

| | | | |
|---|---|---|---|
| 4,263,651 | 4/1981 | Donath et al. | 364/491 |
| 4,970,664 | 11/1990 | Kaiser et al. | 364/488 |
| 5,452,228 | 9/1995 | Arakawa et al. | 364/489 |
| 5,463,563 | 10/1995 | Bair et al. | 364/490 |
| 5,508,937 | 4/1996 | Abato et al. | 364/488 |
| 5,555,201 | 9/1996 | Dangelo et al. | 364/489 |

FOREIGN PATENT DOCUMENTS

| | | |
|---|---|---|
| 5-225280 | 9/1993 | Japan . |
| 5-225286 | 9/1993 | Japan . |

*Primary Examiner*—Vincent N. Trans
*Attorney, Agent, or Firm*—Staas & Halsey

[57] ABSTRACT

The invention provides a path analyzing displaying apparatus for designing a logic circuit which can achieve reduction in intervention degree of a designer and expansion of human interface with a minimum portion which requires intervention. The apparatus comprises a graphic screen for displaying information necessary for path analysis of a logic circuit of an object of designing. Logic circuit components are grouped into a target group including a noticed point determined based on a logical simulation output result and any of the logic circuit components which can have an influence on the noticed point and a non-target group which includes those logic circuit components which do not have an influence on the analysis point, and the graphic screen displays the logic circuit components separately in the target group and the non-target group. The apparatus is applied to design a logic circuit of an LSI, a PCB or the like.

16 Claims, 11 Drawing Sheets

(PARTITION)

TARGET GROUP

FIG. 15
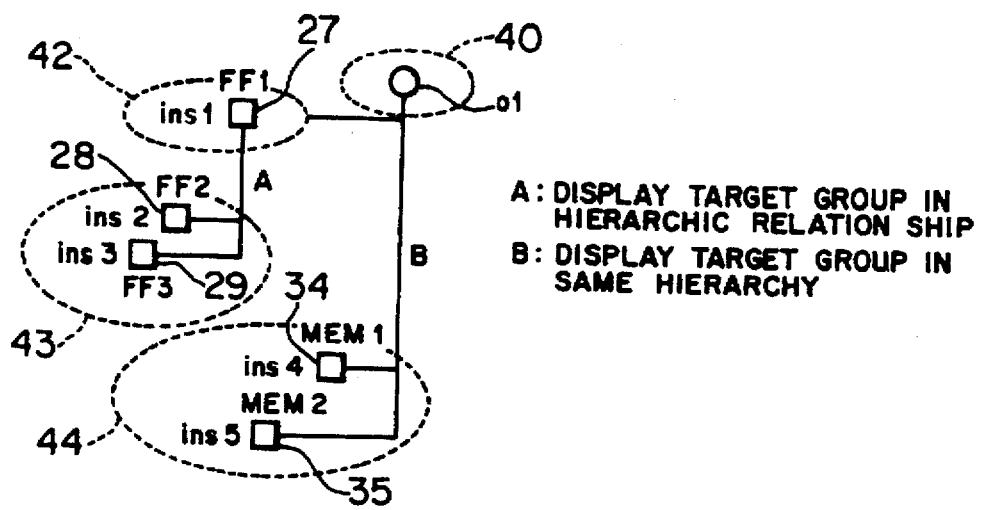
A: DISPLAY TARGET GROUP IN HIERARCHIC RELATION SHIP
B: DISPLAY TARGET GROUP IN SAME HIERARCHY
FIG. 16
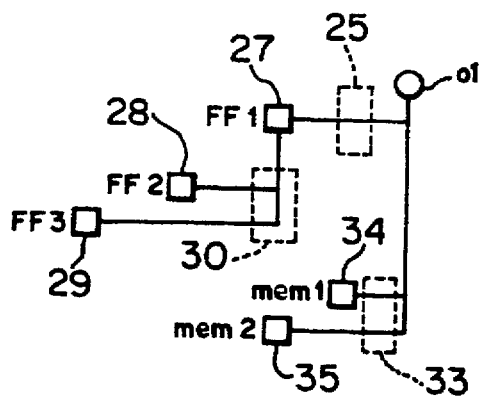
FIG. 17
(PATH ANALYSIS GUIDE MENU)
① EXPANSION PROCESSING
② REDUCTION PROCESSING
③ PARTITION PROCESSING
④ MACRO PROCESSING

/ 1

PATH ANALYZING DISPLAYING APPARATUS FOR DESIGNING LOGIC CIRCUIT

BACKGROUND OF THE INVENTION

1. Field of the Invention

This invention relates to an apparatus for use to design a logic circuit of an LSI, a printed circuit board (PCB) or the like, and more particularly to a path analyzing displaying apparatus suitable for use for path tracing analysis which is performed in function analysis, delay analysis, logical connection checking and so forth for large scale logic data or hierarchical structure data.

2. Description of the Related Art

In a path analyzing technique which is employed popularly at present, while a logic circuit diagram is observed on paper or a graphic screen, a cause from which a noticed event originates is detected by manual operation by a searching technique called back tracing, or an instruction of coordinates of a circuit is inputted in accordance with a program and a condition resulted from the instruction is confirmed, and such instruction and conformation are repeated to analyze a final cause of occurrence of an event.

In order to perform such a path analysis as described above, a noticed confirmation point (point of examination to discover a cause) is instructed by manual operation, and in accordance with a result of the analysis, a next confirmation point is instructed to investigate a final cause event.

More particularly, according to an ordinary path analysis technique, a result of an output of simulation or a result of a check of a circuit is displayed on such a circuit diagram base (network list, circuit display screen or the like) as shown in FIG. 21, and a designer retrieves and analyzes the circuit diagram (screen) based on the display information to pursuit a location making a cause (macro, network or the like of a circuit).

For example, if the designer discovers that, as shown in FIG. 21, the state (output condition) of a noticed point (point for analysis) o1 (output terminal of a macro *0) has an indefinite value "X", the designer investigates an object path and location while determining from the circuit diagram (or also from the screen) which location (macro, network or the like) in the circuit has an influence upon the same.

A basically unacceptable value may possibly appear in three cases including ① a case wherein it arises from a macro itself, ② another case wherein it arises from a connection relationship, and ③ a further case wherein it arises from data inputted.

In a flow of such investigation processing as described above, a noticed point is first confirmed (that is, a location from which an unacceptable value originates is discovered based on a result of an output of simulation), and a connection relationship of the noticed point to a preceding stage or stages is determined from the circuit diagram to discover a model (macro, I/O pin or the like) which may possibly have an influence, and then a cause is sought while confirming an output data value of the model.

For example, in the example shown in FIG. 21, if it is assumed that an indefinite value X appears as an output value at the notice point o1, then the indefinite value X possibly originates from the macro *0 itself which has an output terminal at the noticed point o1 if the values at input terminals i1 and i2 of the macro *0 are normal, or, on the contrary if the value at the input terminal i1 or i2 of the macro *0 is abnormal, the indefinite value X possibly originates from one of the other macros *1 to *5. In each case, back tracing is performed in order from the noticed point to perform a path analysis to investigate data making a cause.

It is to be noted that, while "macro" normally signifies a circuit mark or a circuit name applied to a component, an element or the like constituting a circuit, it herein denotes a group of elements constituting a circuit, a part constituting a circuit or a symbol itself of a circuit construction displayed on a circuit diagram or a screen and denotes a component itself of a logic circuit.

With the path analyzing technique described above, however, since the path analysis efficiency relies much upon the know-how such as experience or skill or the ability of the designer who actually performs a logical simulation path analysis (discovery of a noticed point, path tracing and so forth), depending upon the designer, simulation processing of a logic circuit requires a comparatively great number of man-hours or working hours. Further, an increasing number of working hours will be required for path analysis of large scale logic data which are supposed to increase in future.

SUMMARY OF THE INVENTION

It is an object of the present invention to provide a path analyzing displaying apparatus for designing a logic circuit which realizes reduction in intervention degree of a designer in a path analyzing operation and expansion of human-interface with a portion which at least requires intervention so that a logical simulation path analysis can be performed without relying upon the know-how or the ability to achieve reduction in time for steps in an entire designing work, improvement in design quality and reduction in cost.

In order to attain the object described above, according to the present invention, there is provided a path analyzing displaying apparatus for designing a logic circuit, comprising a display section for displaying information necessary for path analysis of a logic circuit of an object of designing, and means for grouping logic circuit components, which constitutes the logic circuit of the object of designing, into a target group including an analysis point determined based on a logical simulation output result of the logic circuit of the object of designing and any of the logic circuit components which can have an influence on the analysis point and a non-target group which includes those logic circuit components which do not have an influence on the analysis point and causing the display section to display the logic circuit components separately in the target group and the non-target group.

In the path analyzing displaying apparatus for designing a logic circuit, logic circuit components are grouped into a target group including those logic circuit components which can have an influence on an analysis point and a non-target group which includes those logic circuit components which do not have an influence on the analysis point, and the logic circuit components of the target group and the non-target group are displayed separately on the display section. Consequently, the designer can readily grasp any logic circuit component (target point) which can have an influence on an analysis noticed event at the analysis point with certainty. Accordingly, with the path analyzing displaying apparatus for designing a logic circuit, a logical simulation path analysis can be performed without relying upon the know-how or the ability of the designer, and the design efficiency can be improved remarkably.

The path analyzing displaying apparatus for designing a logic circuit may further comprise means for erasing the display of the non-target group from the display section. Where the display of the non-target group is erased from the display section, the displaying condition on the display section is simplified. Consequently, by paying attention only to those logic circuit components relating to the analysis noticed element, the designer can grasp any target point with a higher degree of certainty, which further contributes to improvement in design efficiency.

Or, the grouping means may cause the display section to display only those logic circuit components which correspond to an analysis noticed element designated in advance as the target group. Since only those logic circuit components which correspond to the analysis noticed element are displayed, by paying attention only to those logic circuit components relating to the analysis noticed element, the designer can grasp any logic circuit component which can have an influence on an analysis noticed event at the analysis point as well as any target point with a higher degree of certainty, which further contributes to improvement in design efficiency.

In this instance, the path analyzing displaying apparatus for designing a logic circuit may further comprise means for causing the display section to display information necessary to designate the analysis noticed element as a guide menu. By observing the guide me nu on the display section, the designer can be guided by information necessary for designation of an analysis noticed element, and consequently can designate an analysis noticed element readily. Consequently, operation of the designer can be facilitated as much. Or, the grouping means may cause the display section to display each of the logic circuit components in the form of a dot and cause the display section to display each of connection relationships between the logic circuit components in the form of a branch. Where each of the logic circuit components is displayed in the form of a dot and each of connection relationships between the logic circuit components is displayed in the form of a branch, that is, where a pinpoint display is employed, the displaying condition of the display section is further simplified. In this instance, the grouping means may cause the display section to display, at displayed locations of the dots indicating the logic circuit components, information which can specify the logic circuit components. Or, the grouping means may cause the display section to display, at displayed locations of the dots indicating the logic circuit components, delay times from the analysis point to the logic circuit components. Where, at displayed locations of the dots indicating the logic circuit components, information which can specify the logic circuit components or delay times from the analysis point to the logic circuit components are displayed, the designer can perform detailed checking observing the display and grasp any logic circuit component which can have an influence on an analysis noticed event at the analysis point with a higher degree of certainty, which further contributes to improvement in design efficiency.

Or else, the grouping means may further group the target group into a nucleus group including the analysis point and those logic circuit components which can directly have an influence on the analysis point and a plurality of associated groups each including a logic circuit component or components which can have an influence on the nucleus group and cause the display section to display the nucleus group and the associated group, the grouping means further causing the display section to display a connection relationship between the nucleus group and the plurality of associated groups. Where the target group is grouped into a nucleus group and a plurality of associated groups and they are displayed together with connection relationships between them on the display section, the designer can grasp any logic circuit component, which can have an influence on an analysis noticed event at the analysis point, readily and definitely in units of a group, and the path analyzing displaying apparatus can cope with large scale logic data readily.

In this instance, the grouping means may group, where the target group includes a plurality of logic circuit components which exhibit a hierarchic structure, the plurality of logic circuit components exhibiting the hierarchic structure into an upper hierarchy group to which those logic circuit components of an upper hierarchy belong and a lower hierarchy group to which those logic circuit components of a lower hierarchy belong, and cause the display section to display the upper hierarchy group and the lower hierarchy group in an hierarchically connected condition. Where such hierarchic display is employed, the logic circuit components can be displayed in different groups on the display section without destroying the hierarchic relationship of any portion which has a hierarchic structure, and the designer can grasp the hierarchic relationship definitely by observing the display on the display section. Consequently, the designer can grasp any logic circuit component, which can have an influence on an analysis noticed event at the analysis point, readily and definitely in units of a group, and the path analyzing displaying apparatus can cope with large scale logic data readily.

Or, the grouping means may include an automatic grouping processing section for automatically performing grouping of the target group displayed on the display section by back tracing the logic circuit components from the analysis point in accordance with the analysis noticed element designated in advance. Where the target group can be automatically grouped by the automatic grouping processing section in this manner, confirmation of a point which makes a target is facilitated and the path analyzing operation by the designer can be moderated as much. Consequently, facilitation in operability and reduction in man-hours in path analysis can be realized and the design efficiency is improved remarkably.

Or else, the path analyzing displaying apparatus for designing a logic circuit may further comprise an instruction inputting section for inputting an instruction regarding the displaying condition of the display section. Where the instruction inputting section is provided, an instruction regarding the displaying condition of the display section can be inputted from the instruction inputting section.

In this instance, the path analyzing displaying apparatus for designing a logic circuit may further comprise means for causing the display section to display contents of an instruction inputted by way of the instruction inputting section as a guide menu. The designer can thus observe and be guided by the guide menu on the display section and input an instruction regarding the displaying condition readily. Or, the path analyzing displaying apparatus for designing a logic circuit may further comprise a division processing section for grouping the target group displayed on the display section in response to an instruction from the instruction inputting section and causing the display section to divisionally display groups obtained by the grouping, an expansion processing section operable in response to an instruction from the instruction inputting section for causing the display section to display a predetermined logic circuit component as an analysis noticed element in addition to the target group on the display section so that the predetermined logic circuit component may be included into the target group, a deletion processing section operable in response to an instruction from the instruction inputting section for erasing a display of a predetermined logic circuit component from the target group on the display section so that the predetermined logic circuit component may be included into the non-target group, or a group unifying processing section operable in response to an instruction from the instruction inputting section for unifying a plurality of groups forming the target group on the display section into a single group and causing the display section to display the unified group. Thus, by the function of the division processing section, it is possible to display the target group divisionally in different target groups; by the function of the expansion processing section, it is possible to display a predetermined logic circuit component as an analysis noticed element in addition to the target group so that the predetermined logic circuit component may be included into the target group; by the function of the deletion processing section, it is possible to erase a display of a predetermined logic circuit component from the target group so that the predetermined logic circuit component may be included into the non-target group; or by the function of the group unifying processing section, it is possible to unify a plurality of groups forming the target group into a single group and display the unified group. Consequently, by inputting, observing the displaying condition of the display section, an instruction to any of the processing sections from the instruction inputting section, the designer can semi-automatically edit the target group so as to be divided in arbitrary units into groups using a discovering technique. As a result, the path analyzing operation time in a simulation operation for a logic circuit can be reduced remarkably, and the path analyzing displaying apparatus can cope with a large scale circuit readily.

Accordingly, with the path analyzing displaying apparatus for designing a logic circuit according to the present invention, the intervention degree of a designer with a path analyzing operation can be reduced and the human interface with a minimum portion which requires such intervention can be expanded, and a logic simulation path analysis can be performed without relying upon the know-how or the ability of the designer. Further, the time required for steps of an entire design work can be reduced remarkably, and significant improvement in design quality and reduction in cost can be achieved.

Further objects, features and advantages of the present invention will become apparent from the following detailed description when read in conjunction with the accompanying drawings in which like parts or elements are denoted by like reference characters.

BRIEF DESCRIPTION OF THE DRAWINGS

FIG. 15 is a schematic view showing a displaying condition upon grouping processing for first to nth order target groups (associated groups) on the path analyzing displaying apparatus shown in FIG. 1;

FIG. 16 is a schematic view showing a pinpoint displaying condition of a target group on the path analyzing displaying apparatus shown in FIG. 1;

FIG. 17 is a diagrammatic view showing a path analysis guide menu for edition of a target group on the path analyzing displaying apparatus shown in FIG. 1;

DESCRIPTION OF THE PREFERRED EMBODIMENT

Figure 1:
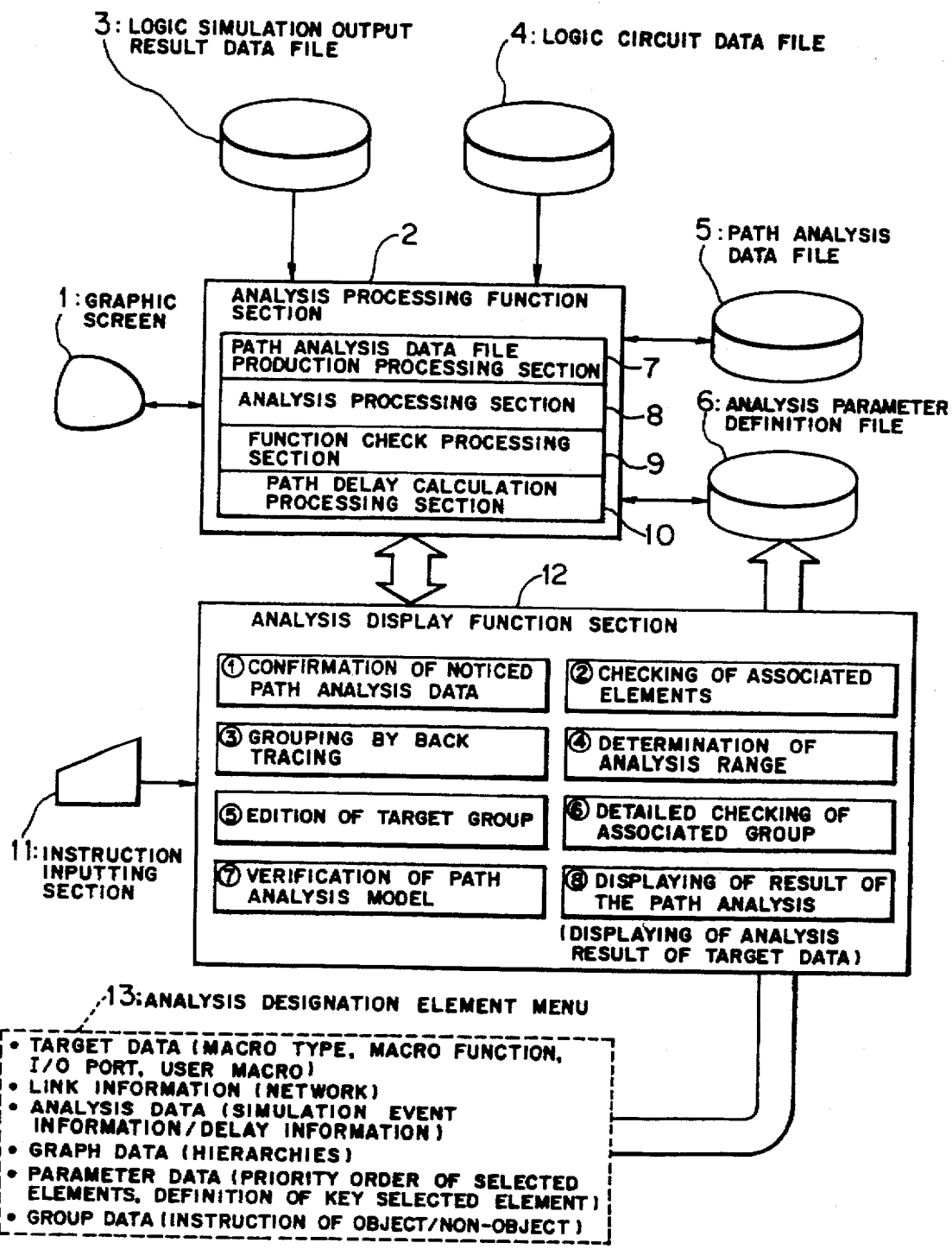
FIG. 1 is a block diagram of a path analyzing displaying apparatus for designing a logic circuit showing a preferred embodiment of the present invention.

Referring first to FIG. 1, there is shown in block diagram a path analyzing displaying apparatus for designing a logic circuit according to a preferred embodiment of the present invention. The path analyzing displaying apparatus shown includes a graphic screen 1 serving as a display section for displaying information necessary for path analysis of a logic circuit of an object of design, and an analysis processing function section 2 for performing path analyzing processing based on various data and controlling displaying on the graphic screen 1.

The path analyzing displaying apparatus further includes a logic simulation output result data file 3 for storing a result of an output of logical simulation of a logic circuit (entire event information), a logic circuit data file 4 for storing a result of designing of a logic circuit (network list or connection information), a path analysis data file 5 for storing data contents (which will be hereinafter described with reference to FIG. 2) produced by a path analysis data file production processing section 7 which will be hereinafter described, and an analysis parameter definition file 6 which is produced by an analysis processing section 8, which will be hereinafter described, based on an analysis noticed element which makes a key for decision of a target group.

The path analyzing displaying apparatus further includes the path analysis data file production processing section 7 and the analysis processing section 8 mentioned above, a function check processing section 9, and a path delay calculation processing section 10. The processing sections 7 to 10 constitute the analysis processing function section 2 described above.

Figure 2:
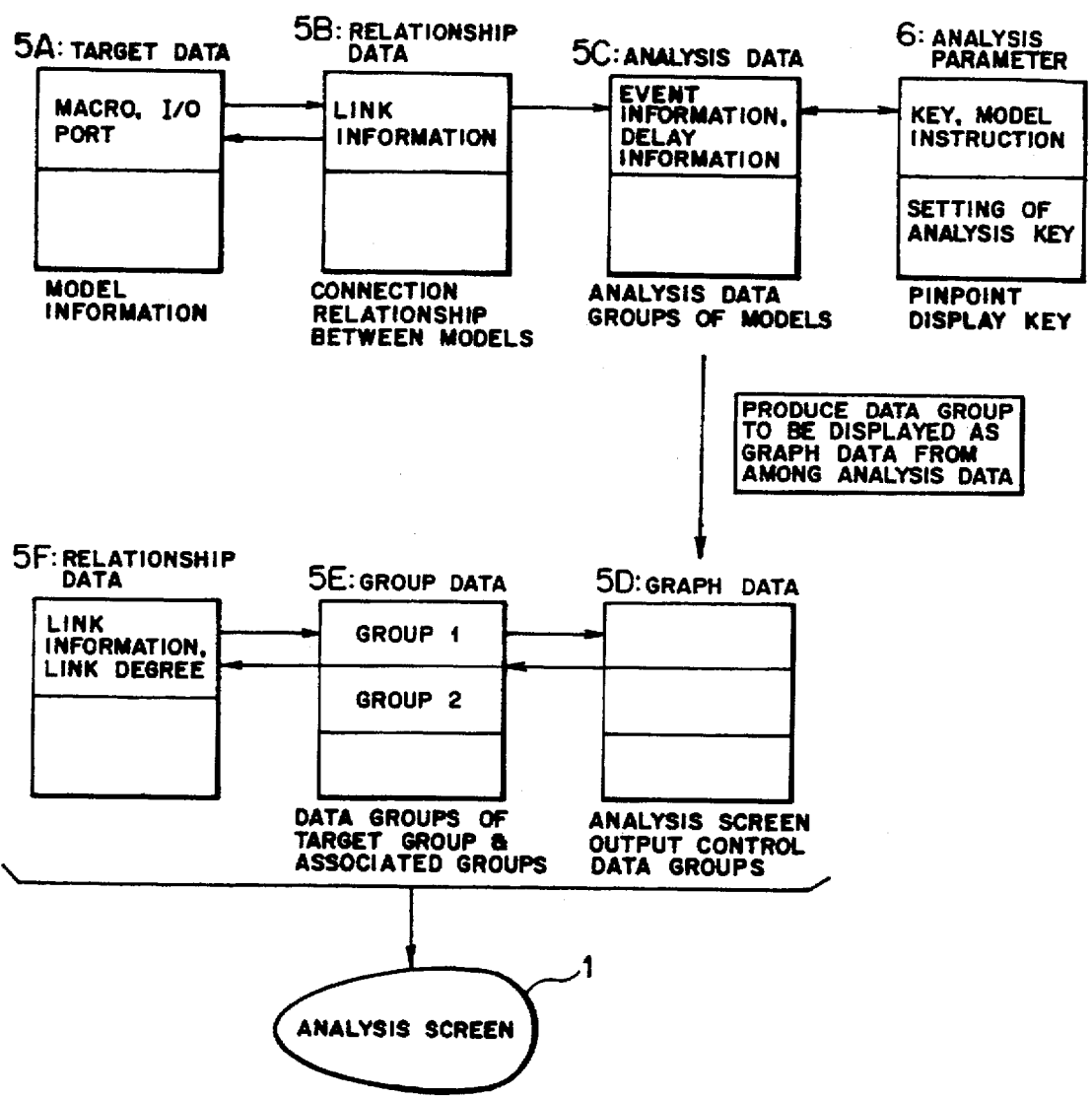
FIG. 2 is a diagrammatic view illustrating contents of a path analysis data file employed in the path analyzing displaying apparatus shown in FIG. 1.

The path analysis data file production processing section 7 produces such a path analysis data file 5 as shown in FIG. 2 based on logical simulation output result data of the file 3 and logic circuit data of the file 4. Such groups of data (various path analysis data) as illustrated in FIG. 2 make input data to the analysis processing section 8.

Referring now to FIG. 2, the path analysis data file 5 includes a target data file 5A, a relationship data file 5B, a analysis data file 5C, a graph data file 5D, a group data file 5E and another relationship data file 5F.

The target data file 5A holds information of a model which makes a key to a path analysis such as a macro type, a macro function, or an I/O port.

The relationship data file 5B holds link information (network or hierarchy) which represents a connection relationship between models. In the relationship data file 5B, information of which model target data have a relationship with and what relationship the target data have with the model is stored, and each such relationship model is linked with analysis data (data stored in the analysis data file 5C) such as in what condition it is (event information, delay information, critical path information or the like).

The analysis data file 5C stores groups of analysis data produced from the relationship data from the relationship data file 5B and an analysis parameter (instruction of a key model, setting of an analysis key (designation of an analysis noticed element)) and regarding models such as event information, delay information or critical path information.

The graph data file 5D holds graph data produced so as to be displayed on the graphic screen (analysis screen) 1 based on the analysis data of the analysis data file 5C. The graph data are a group of data for controlling the displaying condition of the graphic screen 1 and are divided into two kinds of data including display data and control data. The graph data are used to provide various displays such as a pinpoint display or a group display, which will be hereinafter described, on the graphic screen 1.

The group data file 5E stores grouping information (target groups or associated group data groups) for providing a group display on the graphic screen 1 and is linked with the link information or link degrees stored in the relationship data file 5F.

Referring back to FIG. 1, the analysis processing section 8 produces the analysis parameter definition file 6 based on path analysis data of the path analysis data file 5 and an analysis designated element (analysis noticed element). The analysis processing section 8 thus has a function as an automatic grouping processing section which automatically performs grouping of a target group by back tracing from a noticed point (point for analysis) in accordance with the analysis parameter definition file 6 as well as another function of deciding an analysis range based on the grouping and causing the target group to be displayed on the graphic screen 1.

It is to be noted that an analysis designated element (analysis noticed element) to be provided to the analysis processing section 8 is designated by an instruction inputted from an instruction inputting section 11 by a designer observing an analysis designation element menu 13 displayed on the graphic screen 1. In this instance, CAD information of a logic circuit and information which is required in a discovering technique, which will be hereinafter described, of a path analysis are defined by the designer observing the analysis designation element menu 13, and contents of the definition are set as an analysis parameter in the analysis parameter definition file 6.

The contents of definition may be, as seen from the analysis designation element menu 13 of FIG. 1, target data (macro type, macro function, I/O port, or user macro), link information (network), analysis data (simulation event information/delay information), graph data (hierarchies), parameter data (priority order of selected elements, definition of a key selection element), or group data (instruction of object or non-object). Those data make a noticed element in a path analysis (analysis noticed element).

The function check processing section 9 performs edition of a target group and detailed checking of associated groups. The function check processing section 9 further has a function of causing the graphic screen 1 to display an edition condition of a target group and so forth and another function of checking a path route through the displaying a function.

In order to perform edition of a target group, the function check processing section 9 has functions as a division processing section (manual grouping function), an expansion processing section, a deletion processing section and a group unification section (macro processing section).

The division processing section divides a target group on the graphic screen 1 in response to an instruction from the instruction inputting section 11 and causes a result of the grouping to be displayed. The expansion processing section causes a predetermined macro or the like (logic circuit component) to be displayed in addition to a target group on the graphic screen 1 in response to an instruction from the instruction inputting section 11 so as to include the macro or the like into the target group.

The deletion processing section causes a display of a predetermined macro or the like from a target group on the graphic screen 1 in response to an instruction from the instruction inputting section 11 so as to exclude the macro from the target group. The group unification section unifies (makes a macro from) a plurality of groups forming a target group on the graphic screen 1 into a single group in response to an instruction from the instruction inputting section 11.

It is to be noted that the instruction inputting section 11 is constituted from, for example, a keyboard or a mouse to input an instruction regarding the displaying condition on the graphic screen 1. Further, when edition of a target group is performed making use of such functions as described above, in the present embodiment, contents of available instructions which can be inputted from the instruction inputting section 11 are displayed as a guide menu (refer to FIG. 17) on the graphic screen 1.

The path delay calculation processing section 10 decides an actual path route and verifies a path analysis model based on the path route. The path delay calculation processing section 10 has a function of causing the graphic screen 1 to display thereon a result of a path analysis and detailed contents of an analysis model.

The path analyzing displaying apparatus shown in FIG. 1 further includes an analysis display function section 12 which delivers various requests for the analysis displaying condition on the graphic screen 1 to the analysis processing function section 2 or the analysis parameter definition file 6 interactively with a designer in response to an instruction inputted from the instruction inputting section 11 by the designer observing the display on the graphic screen 1. The analysis display function section 12 successively performs, for example, such steps of processing as listed at items ① to ② in the analysis display function section 12 shown in FIG. 1.

In particular, the analysis display function section 12 successively performs, in response to an instruction from the instruction inputting section 11, ① conformation of noticed path analysis data (selection of a noticed point (analysis point), extraction of an analysis noticed element), ② checking of associated elements with the noticed point, ③ grouping by back tracing (request for operation to the automatic grouping function of the analysis processing section 8), ④ decision of an analysis range, ⑤ edition of a target group (request for operation to the edition function of the function check processing section 9), ⑥ detailed checking of associated groups (request for operation to the checking function of the function check processing section 9), ⑦ verification of a path analysis model (request for operation to the verifying function of the path delay calculation processing section 10), and ⑧ displaying of a result of the path analysis (request for operation to the displaying function of the path delay calculation processing section 10).

Subsequently, basic displaying conditions of the graphic screen 1 of the apparatus of the present embodiment having the construction described above will be described with reference to FIGS. 3 to 11.

Figure 3:
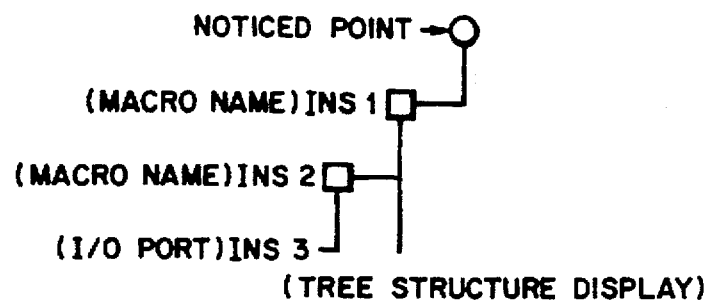
FIG. 3 is a diagrammatic view showing an example of a basic tree-structure display employed in the path analyzing displaying apparatus shown in FIG. 1.

As a method of a path analysis in simulation, a path analysis data file (data base for exclusive use for analysis) 5 is first produced from data of a logic circuit of an object and a result of a simulation output, and for example, as shown in FIG. 3, the relationship between a noticed target (element displayed with the mark ○; macro, I/O port, user macro or the like) and other logic circuit components (elements displayed with the mark □; macro, I/O port, user macro or the like) connected to the target is displayed in the form of a hierarchic graph on the graphic screen 1.

In this instance, each joint portion of the tree structure represents a logic circuit component, and at a displaying location of the same, the name of the macro or I/O port (INS1 to INS3 in FIG. 3; INS is an abbreviation of instance) is displayed additionally.

Further, the noticed target (noticed point) here is an analysis point obtained based on simulation output result data, and an analysis is started using the point as a key.

Figure 4:
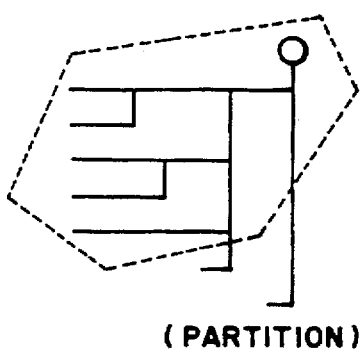
FIG. 4 is a diagrammatic view illustrating a basic partition function of the path analyzing displaying apparatus shown in FIG. 1.

The display on the graphic screen 1 in the form of a hierarchic graph is performed, for example, in such a form as shown in FIG. 4, in which associated points (macros, I/O ports and so forth) and a connection relationship of them are represented in a tree structure so that a group whose nucleus is provided by the noticed point and key model (model having an influence on the noticed point) groups can be confirmed readily by the partition function and grouping.

Figure 5:
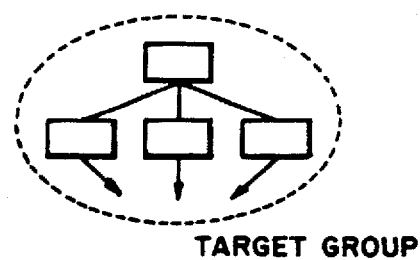
FIG. 5 is a diagrammatic view schematically showing an associated data group extracted by the basic partition function illustrated in FIG. 4.

The partition function is a function of extracting an associated data group (analysis noticed element group) using contents of the analysis parameter definition file 6 as a key. The partition function can be executed either by automatic processing by the analysis processing section 8 described above or by manual processing in which it is executed by a designer inputting an instruction from the instruction inputting section 11. If an associated data group is extracted by the partition function, for example, from an area (target group) surrounded by a broken line in FIG. 4, then, for example, such a display as shown in FIG. 5 is provided on the graphic screen 1. It is to be noted that each block frame in FIG. 5 indicates a macro or the like of the associated data group.

After an associated data group is extracted by the partition function (refer to ⓞ of the analysis display function section 12 of FIG. 1), the associated elements are checked (refer to Ⓒ of the analysis display function section 12 of FIG. 1), and then in order to limit the analysis range in accordance with a mutual relationship between groups and manual intervention from an analysis guide (the analysis designation element menu 13) to facilitate conformation of a route of a path analysis, division processing into a target group and non-target groups is performed. Upon such division processing, the analysis range is fixed using the partition function of extracting data having an influence on the noticed point, and back tracing/forward tracing is performed so that detailed confirmation of the influence data or division of the target group (division into a nucleus group and associated groups) can be performed.

Figure 6:
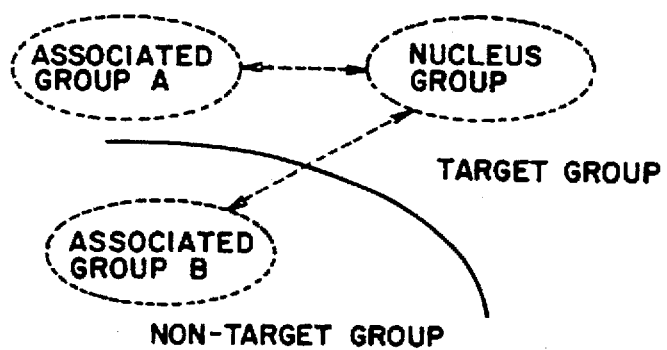
FIG. 6 is a diagrammatic view schematically illustrating an example of dividing processing into a target group and a non-target group employed in the path analyzing displaying apparatus shown in FIG. 1.

Consequently, as seen in FIG. 6, from the analysis object data centered at the nucleus group, an associated group B can be deleted as a non-target group while leaving another associated group A as a target group (refer to ③ to ⑤ of the analysis display function section 12 of FIG. 1).

Then, in order to check the target group obtained by division as described above, for example, as shown in FIG. 7, each macro or the like (analysis noticed element) which makes a key in the target group is displayed in a simple display form (pinpoint display) on the graphic screen 1, and while performing detailed checking observing the display, verification of a path analysis model is proceeded to obtain a result of the analysis of the target data (refer to ⑥ to ⑧ of the analysis display function section 12 of FIG. 1).

Figure 11:
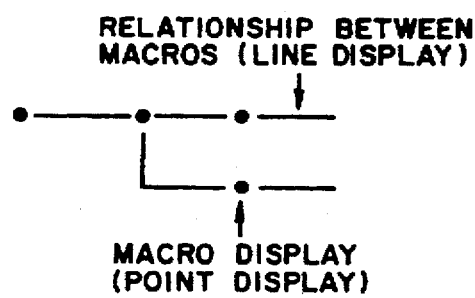
FIG. 11 is a diagrammatic view showing an example of a display of a hierarchic structure model on the path analyzing displaying apparatus shown in FIG. 1.

It is to be noted that, in FIG. 7, a function display of a portion which makes a key is provided at each joint of the tree structure, and "FF" denotes a flip-flop, "USER MODEL" denotes a model defined in advance by a user (hierarchic macro which will be hereinafter described with reference to, for example, in FIGS. 11 and 13), and "mem1" and "mem2" denote each a memory element.

Figure 7:
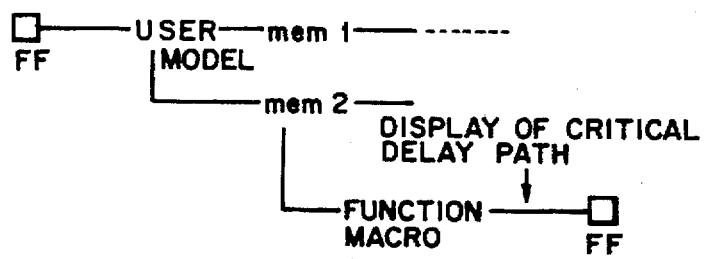
FIGS. 7 and 8 are diagrammatic views showing different examples of a pinpoint display on the path analyzing displaying apparatus shown in FIG. 1.

Further, if an instruction to display a critical delay path is inputted from the instruction inputting section 11 while the display on the graphic screen 1 is such as shown in FIG. 7, a path corresponding to a critical delay path (path which exhibits the lowest signal propagation) from among the circuits shown in FIG. 7 is displayed emphatically in a different displaying color or like means on the graphic screen 1.

Figure 8:
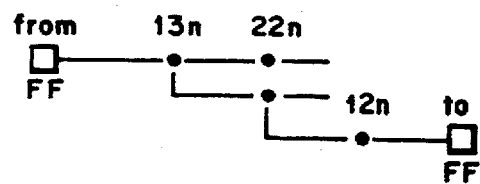

Furthermore, if a request for a display for guiding an analysis order in regard to a noticed path route of the circuit of such a target group as shown in FIG. 7 is inputted from the instruction inputting section 11, then displays of object items of a start point (from) and an end point (to), a display between the object items, and a display of data of pin delay information are automatically provided so that, for example, such a pinpoint display as shown in FIG. 8 is provided. In particular, "from" and "FF" are displayed at a point from which an analysis is to be started while "to" and "FF" are displayed at another point at which the analysis is to be ended, and a delay time (in units of n (nanosecond) in FIG. 8) is displayed at the displaying location of each of pins (points) such as macros between FF and FF.

Figure 9:
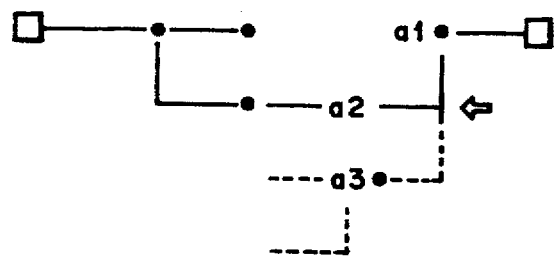
FIG. 9 is a diagrammatic view illustrating an extraction/deletion function of an analysis object circuit of the path analyzing displaying apparatus shown in FIG. 1.

Further, in order to allow an analysis object circuit to be partially displayed freely upon analysis of a logic circuit, the apparatus of the present embodiment may additionally have an extraction/deletion function of the analysis object circuit. In this instance, the apparatus has an automatic simulation model production function (to provide a display centered at a pinpoint) which can partially extract a simulation model arbitrarily while a pinpoint display is provided on the graphic screen 1. By the automatic simulation model production function, an entire page or a function group unit can be represented with a single point or an arbitrary location of a circuit can be represented in a pinpoint to display an analysis object model. Consequently, for example, as shown in FIG. 9, by hitting (clicking) an arrow mark portion in FIG. 9 by means of the instruction inputting section 11 such as a mouse, a broken line portion in FIG. 9 can be displayed in an extracted condition or can be erased.

Figure 10:
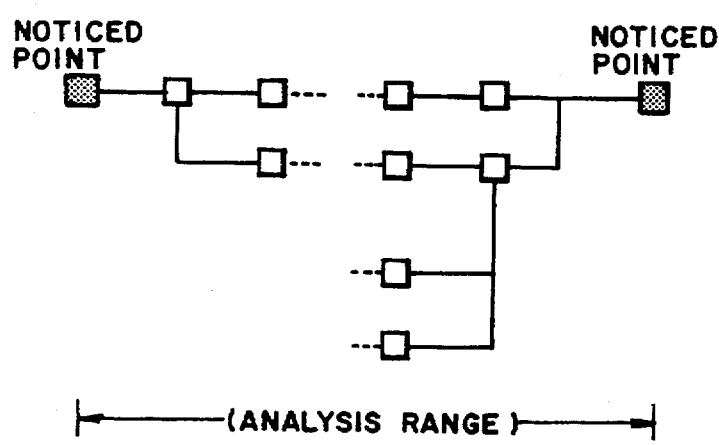
FIG. 10 is a diagrammatic view showing an example of a display of a noticed point and an analysis range on the path analyzing displaying apparatus shown in FIG. 1.

When a logic circuit is analyzed, a simulation object model can be analyzed readily by displaying a graph, wherein a noticed point is displayed as a nucleus apex, on the graphic screen 1 using the displaying function described hereinabove with reference to FIGS. 3 to 10. In particular, by deciding an element of a selected point (analysis noticed element) to decide a noticed point, a graph with the noticed point arranged at a nuclear (apex) is displayed on the graphic screen 1 as shown in FIG. 10.

Consequently, the situation of the noticed point which makes a target can be confirmed readily as an image, and besides the analysis range (refer to FIG. 10) can be limited. Consequently, confirmation of a path analysis and incidentally an analysis of a simulation object model can be performed readily.

It is to be noted that the selection point mentioned hereinabove may be in the phase of a function (logic model, design hierarchic model, functional attribute or the like) or in the phase of a circuit (network, node, I/O, page, block or the like), and the analysis range may be a path route range between FF and FF or an analysis possibility path range of the indefinite state X.

Further, in the present embodiment, when a logic circuit is analyzed, also macro information in accordance with a hierarchic structure can be displayed for a model on hierarchic structure data. In particular, by displaying all circuit information connected to a noticed point by a pinpoint display with points and lines as shown, for example, in FIG. 11, also macros which have a hierarchic structure can be displayed on the graphic screen 1 while showing the hierarchic relationship between them clearly. Consequently, reduction of the connection data amount and improvement in noticeability in selection of an analysis noticed element (clarification of the relationship) can be realized. It is to be noted that a point display is a macro display of circuit information, and a line display indicates relationship information between macros.

Furthermore, in the present embodiment, when a logic circuit is analyzed, a noticed model (macro)/element can be displayed by a pinpoint display described hereinabove with reference to FIGS. 7 to 11. In particular, by observing the analysis designation element menu 13 and inputting a parameter from the instruction inputting section 11 for an element which is significant for simulation (which is restricted by a condition with respect to time or whose state value varies with respect to time). The pinpoint display model may be, as shown in FIG. 7, a memory element, a user model, a function macro, a clock path, a scanning path, a critical delay path or the like. By such instruction function of a noticed model, a model to be noticed can be searched readily, and a model having a high degree of influence in simulation can be confirmed readily.

Figure 12:
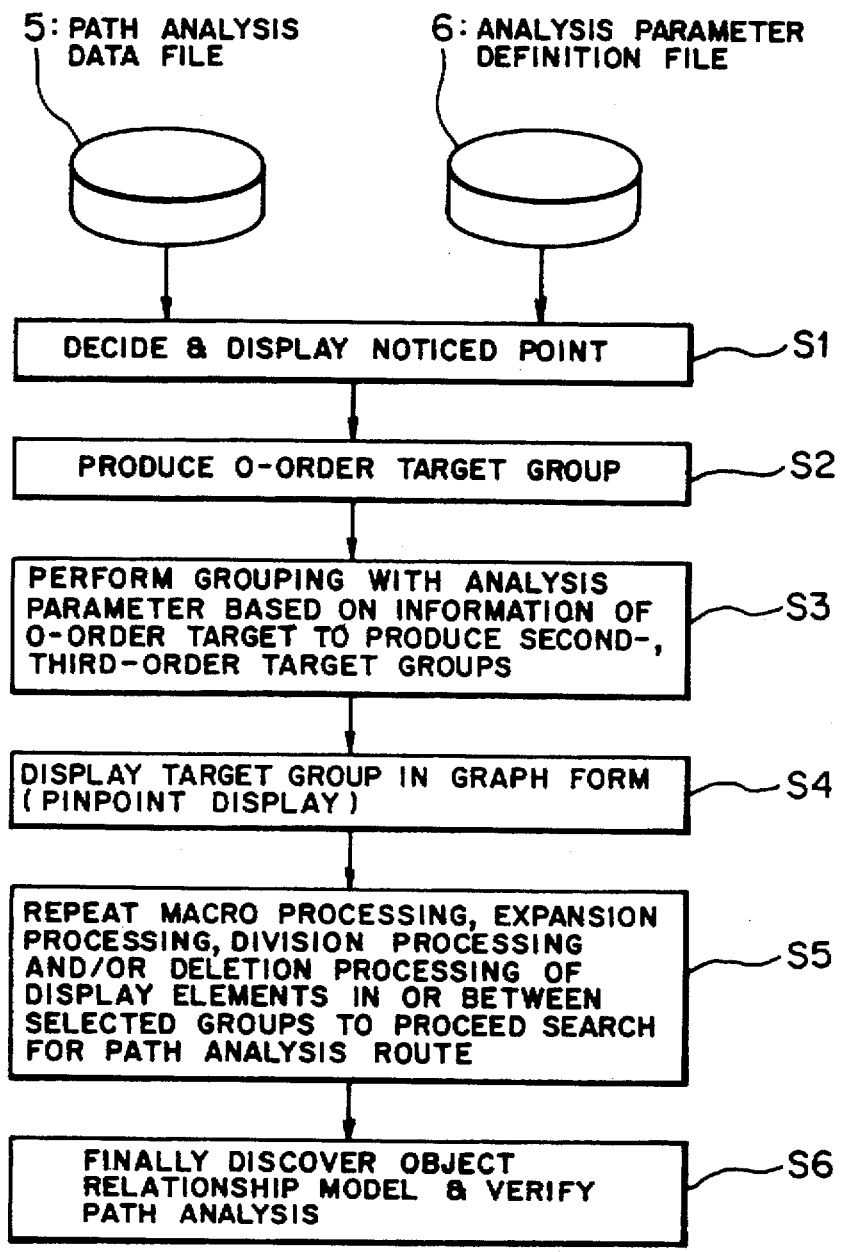
FIG. 12 is a flow chart illustrating a detailed procedure of a path analyzing process of the path analyzing displaying apparatus shown in FIG. 1.

Subsequently, a detailed path analysis procedure in the present embodiment will be described with reference to a flow chart (steps S1 to S6) shown in FIG. 12. First, after execution of logical simulation, a noticed point (noticed event) confirmed by a path analysis is decided based on data of the path analysis data file 5 and the analysis parameter definition file 6, and the noticed point is displayed on the graphic screen 1 (step S1; refer to, for example, o1 in FIG. 13).

Figure 14:
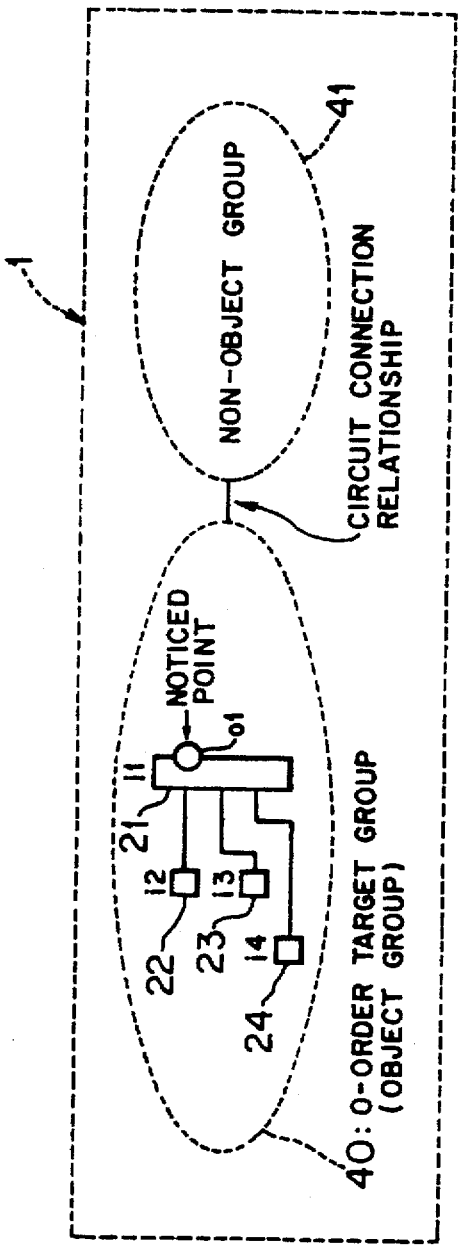
FIG. 14 is a schematic view showing a displaying condition upon grouping processing for a 0-order target group (nucleus group) on the path analyzing displaying apparatus shown in FIG. 1.

Then, an analysis element at the noticed point and a shortest search element (macro connected to the preceding stage) to a target point (refer to FIG. 6) to be detected are decided to produce a 0-order target group (nucleus group) (step S2; refer to FIG. 14).

Based on information of the 0-order target group, grouping processing of the target group is performed instructing a macro function or a connection relationship with an analysis parameter defined in the analysis parameter definition file 6 to produce a second-order target group, . . . , and an nth-order group (associated groups) (step S3; refer to FIG. 15). In each group, any other circuit elements than a designated element or elements (target data) are regarded as all belonging to a non-object group and are not displayed.

Then, the inside of each of the target groups obtained by the grouping is displayed in the form of a graph (pinpoint display form) (step S4; refer to FIG. 16). In this instance, only those element models (macros) which have a high degree of influence originating from the noticed event are displayed.

Figure 18:
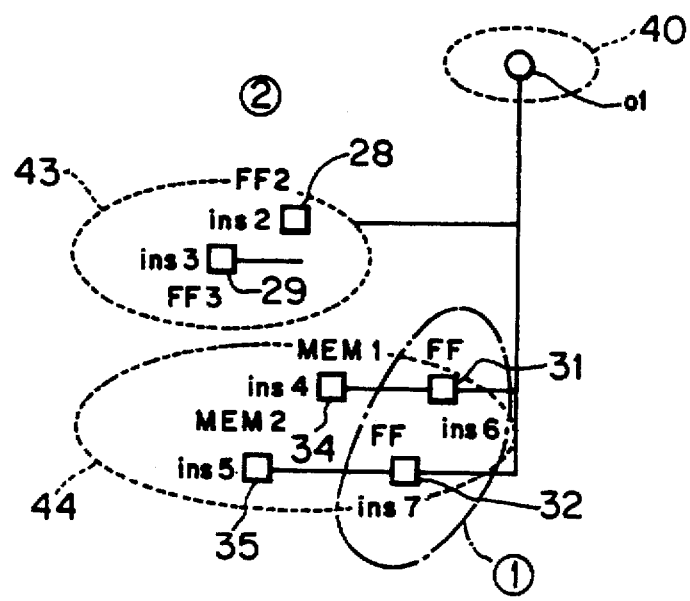
FIGS. 18 and 19 are schematic views showing different displaying conditions upon edition and illustrating a target group editing function of the path analyzing displaying apparatus shown in FIG. 1.
Figure 19:
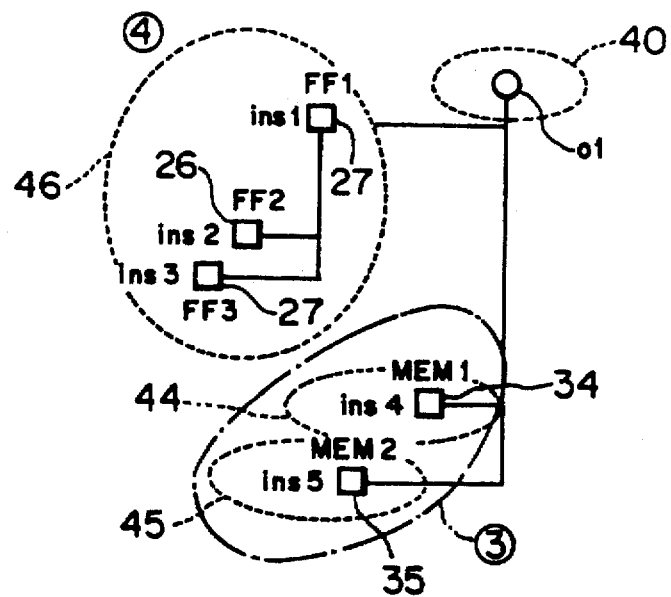

A pinpoint display of them is provided on the graphic screen 1, and searching for a path analysis route is proceeded observing the display and repeating macro processing, expansion processing, division processing and/or deletion processing of a display element or elements in a selected group or between selected groups (step S5; refer to FIGS. 18 and 19). Such processing is performed by a designer observing the path analysis guide menu (refer to FIG. 17) on the graphic screen 1 and operating the instruction inputting section 11. In other words, the analysis range is limited by manual intervention to confirm a path analysis route.

Figure 20:
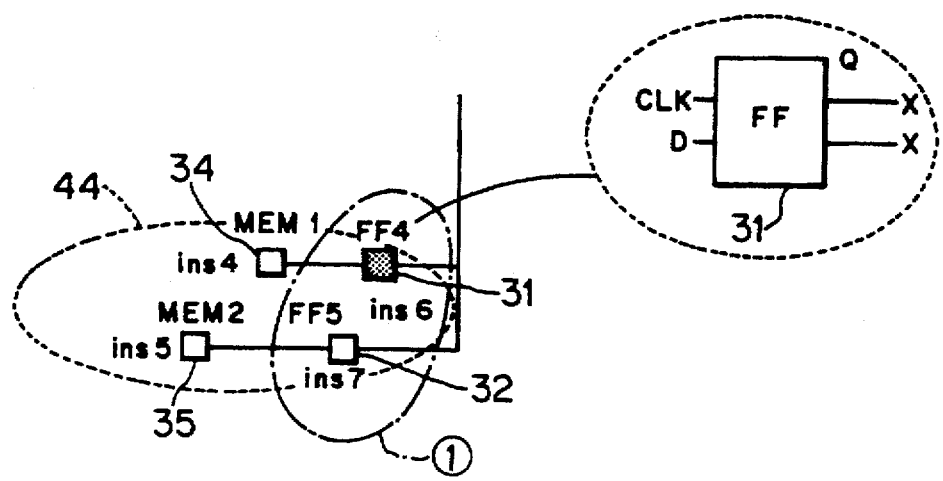
FIG. 20 is a schematic view showing a displaying condition of a final analysis screen on the path analyzing displaying apparatus of FIG. 1.
Figure 21:
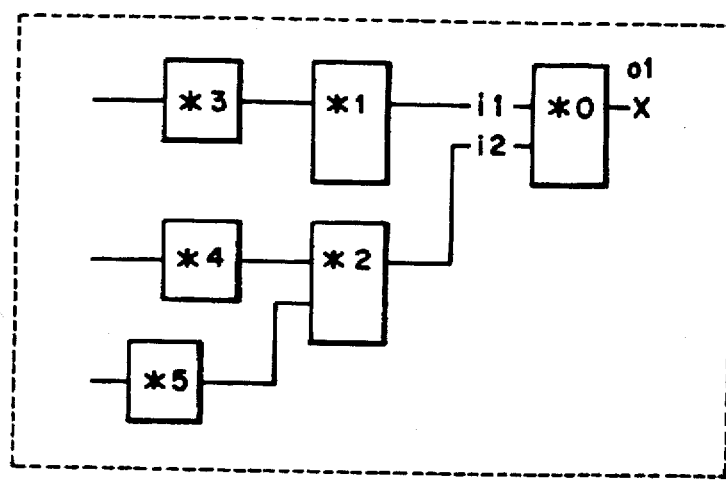
FIG. 21 is a diagrammatic view showing an example of a circuit diagram on a screen or paper and illustrating an ordinary path analyzing technique.

Finally, an object relationship model is discovered, and the path analysis is verified (step S6; refer to FIG. 20). Consequently, a group or groups having a cause of occurrence of the event in question of the 0-order target group and detailed information can be detected.

Subsequently, the displaying conditions on the graphic screen 1 when a path analysis is performed in such a procedure as described above will be described with reference to FIGS. 13 to 20.

In the present embodiment, in a path analysis which is performed in a function analysis, a delay analysis, a logical connection check and so forth of a logic circuit, a cause originating location (target point) of a noticed event on an object logic circuit model (expected value (event result), critical delay path, noticed path, noticed circuit or the like) is discovered by performing grouping (division into macros) in units of an element of high possibility and performing back tracing to perform a path analysis.

In this instance, in the present embodiment, the path analysis is performed guiding it by means of the representation means (macro representation; refer to FIG. 15) in the form of a graph in what structure the noticed event (refer to FIG. 13) is associated. Details of the path analysis processing will be described below together with the displaying conditions on the graphic screen 1.

Figure 13:
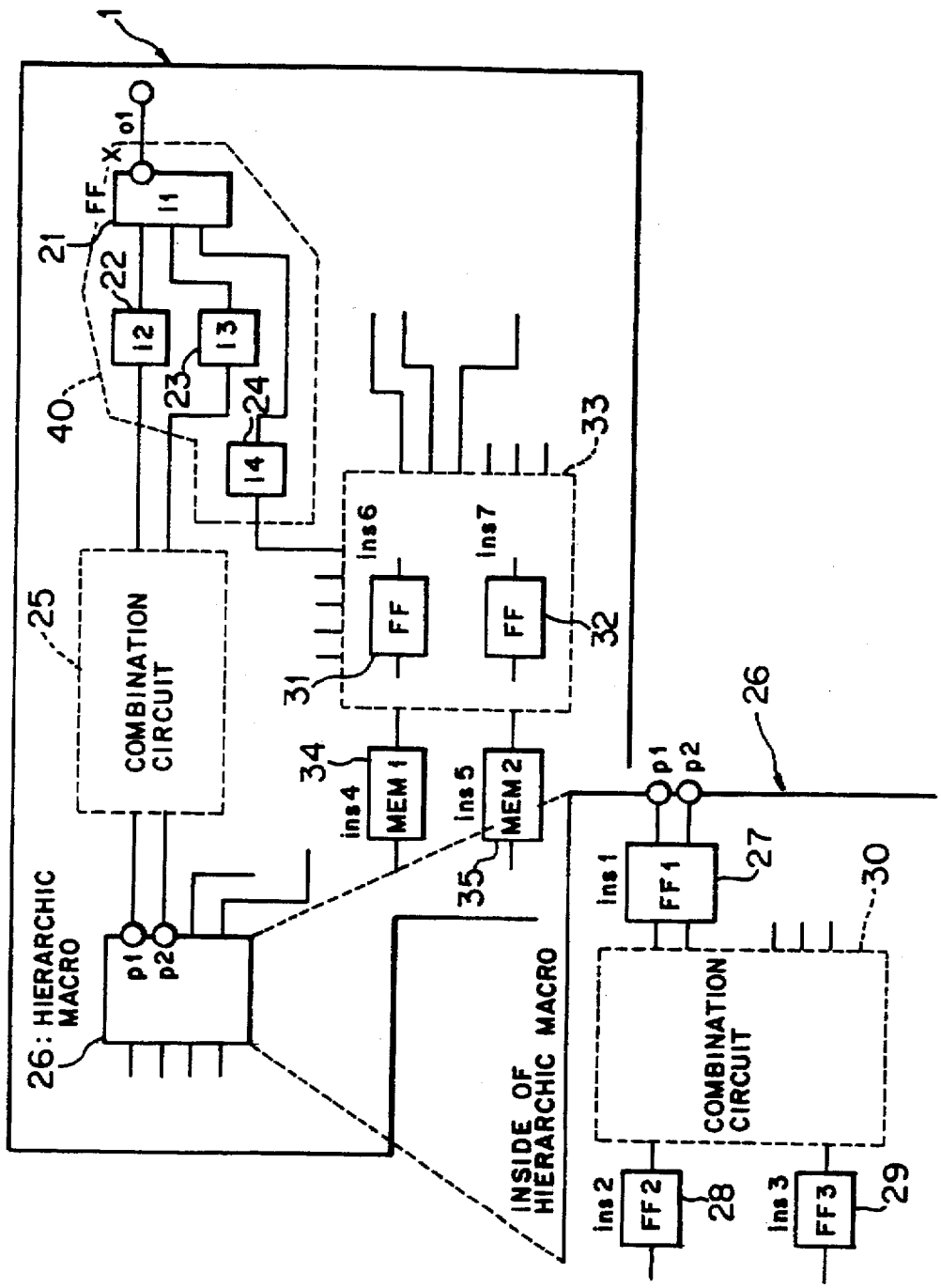
FIG. 13 is a diagrammatic view showing an example of a detailed display of a logic circuit of a path analysis object on the path analyzing displaying apparatus shown in FIG. 1.

Here, it is assumed that the logical circuit of the path analysis object is, for example, such a circuit as shown in FIG. 13. A circuit diagram of the logic circuit is displayed on the graphic screen 1.

Although a noticed point (noticed event) on the logic circuit to be confirmed by a path analysis is decided after execution of simulation, in the present embodiment, an example wherein an output terminal o1 of a macro (which functions as a flip-flop) 21 of the instance name i1 on the logic circuit diagram shown in FIG. 13 and a location (or event) which makes a cause of making the state of the output terminal o1 an indefinite value X (noticed event).

It is to be noted that, in the logic circuit diagram shown in FIG. 13, logic circuit components on a route which can have an influence on the noticed point (output terminal o1) are shown, and reference numerals 22 to 24 denote macros of the instance names i2 to i4 connected directly to the macro 21, respectively, reference numeral 25 denotes a combination circuit arranged at the preceding stages to the macros 22 and 23, and 26 a hierarchic macro disposed at the preceding stage to the combination circuit 25.

The hierarchic macro 26 is a user macro set in advance based on an arbitrary macro by a user and is constructed hierarchically from a plurality of macros. Details of the hierarchic macro 26 shown in FIG. 13 can be displayed by a window display as shown in an enlarged scale in FIG. 13, for example, by operating the instruction inputting section 11.

Those of the elements constituting the hierarchic macro 26 in the present embodiment which can have an influence on the noticed point (output terminal o1) are the elements connected to terminals p1 and p2, that is, macros 27 to 29 and a combination circuit 30.

The macro 27 functions as a flip-flop (FF1) and has the instance name ins1, and is connected directly to the terminals p1 and p2. The macros 28 and 29 individually function as flip-flops (FF2 and FF3) and have the instance names ins2 and ins3, and are connected to the macro 27 by way of the combination circuit 30.

Meanwhile, reference numeral 33 denotes a sequence circuit arranged at the preceding stage to the macro 24. The sequence circuit 33 is constituted from a pair of macros 31 and 32 each of which functions as a flip-flop (FF). Reference numerals 34 and 35 denote macros connected to the macro 24 by way of the sequence circuit 33. The macros 34 and 35 function as memory elements (MEM1, MEM2), respectively. It is to be noted that the macros 34 and 35 have the instance names ins4 and ins5, respectively, and the macros 31 and 32 have the instance names ins6 and ins7, respectively.

In the present embodiment, as a procedure of analysis of a cause originating location from a noticed point (micro information), as seen in FIG. 13, a 0-order target group (nuclear group) 40 is designated with noticed elements any of which may be a cause originating location with a high degree of probability, that is, the macros 21 to 24 substantially directly connected to the output terminal o1. Consequently, as shown in FIG. 14, the macro 21 having the noticed point o1 and the macros 22 to 24 having a first order preceding stage connection relationship to the noticed point o1 are grouped as the 0-order target group 40 on the graphic screen 1, and all circuit elements are displayed divisionally as the 0-order target group (object group) 40 and a non-object group (non-target group) 41 which includes those elements which do not belong to the 0-order target group 40.

After the 0-order target group 40 is decided in this manner, when a location (or event) which makes a cause of occurrence of the state X at the output terminal o1 cannot be confirmed from the displaying condition, the designer will produce, observing the noticed element menu and the analysis guide menu (refer to the analysis designation element menu 13 in FIG. 1), new nth-order target groups from the non-object group 41 by dividing operation and display them on the graphic screen 1.

In the example shown in FIG. 15, as a decision element of a first-order target group 42, any element provided at the preceding stage to the 0-order target group 40 and having a macro function as a flip-flop, that is, the macro (FF1) 27 in the hierarchic macro 26 shown in FIG. 13, is selected and displayed.

Meanwhile, as a decision element of a second-order target group 43, any element provided at the preceding stage to the first-order target group 42 and having a macro function as a flip-flop, that is, two macros (FF2 and FF3) 28 and 29 of the hierarchic macro 26 shown in FIG. 13 are selected and displayed. Thereafter, similar operation instruction and displaying are repeated to successively decide target groups (associated groups).

Finally, in the example shown in FIG. 15, as a decision element of an nth-order target group 44, any element provided at the preceding stage to the 0-order target group 40 and having a macro function as a memory element, in particular, macros 34 and 35 shown in FIG. 13 are selected and displayed.

By the way, when circuit data having a hierarchic structure (hierarchic macro 26 in FIG. 13) such as circuit data of a user macro or the like are present in a top-down design, the structure is represented in a branch display in the form of a graph (tree structure). In FIG. 15, where the first-order target group 42 is upper hierarchy data (refer to the inside of the hierarchic macro 26 in FIG. 13), the frame of the first-order target group 42 and the frame of the second-order target group 43 which indicates the lower hierarchy data are displayed to be connected by way of a connection relationship tree (branch) denoted by "A".

In this instance, since the nth-order target group 44 belongs to the same hierarchy as the 0-order target group 40, the frame of the 0-order target group 40 is displayed to be connected to noticed elements (joints □ in the nth-order target group 44) by way of a connection relationship tree denoted by by "B". On the graphic screen 1 which takes physical conditions (hierarchies) of circuits into account, an expansion displaying method of a target group representation is adopted.

While a connection relationship between target groups which make an object of analysis is displayed by connecting the frames of the groups to each other by way of a branch as seen in FIG. 15, in the present embodiment, such displaying condition can be displayed on the graphic screen 1 with graph elements (joints and branches) of noticed circuit elements.

In particular, if the displaying condition is changed over from such displaying condition as shown in FIG. 15 wherein the target group frames are displayed to another displaying condition wherein the target group frames are not displayed, then a connection relationship tree (graph) constituted from noticed elements is produced and displayed as seen in FIG. 16. This display is defined as a pinpoint display manner, and a connection relationship tree necessary in the minimum for analysis is produced and displayed. Since the combination circuits 25 and 30 and the sequence circuit 33 in FIG. 13 are not analysis designated elements (analysis noticed elements), they are treated as non-object group elements and are not displayed on the graphic screen 1.

Meanwhile, in the present embodiment, in such a displaying condition as seen in FIG. 15, the following edition processing can be performed for target groups and selected noticed elements by the path analysis edition function described above.

In particular, in such a displaying condition as seen in FIG. 15, a designer can perform, by observing such a path analysis guide menu as shown in FIG. 17 and operating the instruction inputting section 11, expansion processing wherein the macros 31 and 32 are additionally displayed as analysis elements in the nth-order target group 44, for example, as shown at a portion ① in FIG. 18.

Further, for example, as shown at another portion ② in FIG. 18, deletion processing of erasing the display of the first-order target group 42, which has been displayed in FIG. 15, to change the first-order target group 42 into a non-object group can be performed. Furthermore, for example, as shown at a portion ③ in FIG. 19, division processing of dividing a portion, which has been displayed as the single target group 44 in FIG. 15, into two target groups (nth-order and n+1th order) 44 and 45 and displaying them divisionally can be performed.

Further, for example, as shown at another portion ④ in FIG. 19, group unifying processing (macro processing) of unifying portions, which have been displayed as the two target groups 42 and 43 in FIG. 15, into a single fourth-order target group 46 and displaying the fourth-order target group 46 can be performed.

By performing such edition processing as described above, the analysis range is limited, and if it is determined that, for example, the macro (FF) 31 in the nth-order target group 44 shown in FIG. 18 is most likely a final target, by hitting the joint □ indicating the macro 31 by operation of the instruction inputting section 11, detailed information of the macro 31 can be displayed as a confirmation screen on the graphic screen 1.

In this instance, taking notice of a simulation output result, a display of detailed information of the macro 31 (a designated element or elements, here a state (event)) is provided on the graphic screen 1 as seen in FIG. 20. In the example in FIG. 20 (final analysis screen), since outputs of the macro 31 all exhibit indefinite values X, it can be determined that the cause which makes the noticed point o1 indefinite originates in the macro 31 (FF).

It is to be noted that, in the present embodiment, in order to realize such processing as displaying and edition processing described hereinabove with reference to FIGS. 13 to 20, production of a target group can be automatically processed in accordance with a default designation of the analysis parameter definition file 6 by the automatic grouping function of the analysis processing section 8 as described hereinabove with reference to FIG. 1.

Further, the analysis processing function section 2 shown in FIG. 1 includes the function check processing section 9, the path delay calculation processing section 10, and an automatic processing section for functions necessary for simulation analysis including circuit connection checking.

Further, in the apparatus shown in FIG. 1, by inputting logic circuit data and logical simulation output result data, the path analysis data file 5 is automatically produced by the path analysis data file production processing section 7 as described hereinabove. Since generally an active element (FF or the like) obtained by a simulation analysis can in most cases make default of a selected element, a graph display in which an active element is designated as a target group is provided automatically by defining a macro function FF as an object of automation by the analysis parameter definition file 6.

In this manner, according to the embodiment of the present invention, upon path analysis of logical simulation, by processing (grouping processing) of grouping a noticed target group in arbitrary units into macros, fixation of an analysis range of a logic circuit and confirmation of detailed contents between models (macros) are facilitated. Consequently, the operation time required for path analysis can be reduced and a path analysis can be performed based on necessary minimum data as a result of grouping. Accordingly, a path analysis of large scale logic data can be performed very readily.

Further, by making use of an analysis parameter of the menu displaying type for a target such as a probing point, automation of the grouping function is promoted, and consequently, a countermeasure nearer to a manner of thinking of human beings can be taken and confirmation of a point which makes a target is facilitated.

Accordingly, with the path analyzing displaying apparatus of the present embodiment, the intervention degree of a designer with a path analyzing operation can be reduced and the human interface with a minimized portion which requires intervention can be expanded. Consequently, a logical simulation path analysis can be performed without relying upon the know-how or the ability of a designer, and the design efficiency can be improved. Further, improvement in reliability in product design and significant reduction in cost can be achieved.

The present invention is not limited to the specifically described embodiment, and variations and modifications may be made without departing from the scope of the present invention.

What is claimed is:

1. A path analyzing displaying apparatus for designing a logic circuit, comprising:

a display; and means for grouping components of the logic circuit into a target group and a non-target group based on a designated analysis point in the logic circuit, the target group including the designated analysis point and any components which is identified as having an influence on a result output at the analysis point, the non-target group including those components which have not been identified as having an influence on the result output at the analysis point and causing said display to display the components in the target group separate from the components in the non-target group.

2. The path analyzing displaying apparatus as claimed in claim 1, further comprising means for erasing the display of the non-target group from said display.

3. The path analyzing displaying apparatus as claimed in claim 1, wherein said grouping means causes said display to display only those components which correspond to an analysis noticed element designated in advance as the target group.

4. The path analyzing displaying apparatus as claimed in claim 3, further comprising means for causing said display to display information necessary to designate the analysis noticed element as a guide menu.

5. The path analyzing displaying apparatus as claimed in claim 3, wherein said grouping means causes said display to display each of the components in the form of a dot and causes said display to display each connection relationship between the components in the form of a branch.

6. The path analyzing displaying apparatus as claimed in claim 5, wherein said grouping means causes said display to display, in connection with each dot, information which specifies the component indicated by the dot.

7. The path analyzing displaying apparatus as claimed in claim 5, wherein said grouping means causes said display to display, in connection with each dot, delay times from the analysis point to each logic circuit component indicated by the dot.

8. The path analyzing displaying apparatus as claimed in claim 3, wherein said grouping means further groups the target group into a nucleus group including the analysis point and those components which directly have an influence on the analysis point and a plurality of associated groups each including those components which have an influence on the nucleus group and causes said display to display the nucleus group and the associated group, said grouping means further causing said display section to display a connection relationship between the nucleus group and the plurality of associated groups.

9. The path analyzing displaying apparatus as claimed in claim 8, wherein said grouping means groups, where the target group includes a plurality of components which exhibit a hierarchic structure, the plurality of components exhibiting the hierarchic structure into an upper hierarchy group to which those components of an upper hierarchy belong and a lower hierarchy group to which those components of a lower hierarchy belong, and causes said display section to display the upper hierarchy group and the lower hierarchy group in an hierarchically connected condition.

10. The path analyzing displaying apparatus as claimed in claim 8, wherein said grouping means includes an automatic grouping processing section for automatically performing grouping of the target group displayed on said display by back tracing the components from the analysis point in accordance with the analysis noticed element designated in advance.

11. The path analyzing displaying apparatus as claimed in claim 8, further comprising an instruction inputting section for inputting an instruction regarding a displaying condition of said display.

12. The path analyzing displaying apparatus as claimed in claim 11, further comprising means for causing said display to display contents of an instruction inputted by way of said instruction inputting section as a guide menu.

13. The path analyzing displaying apparatus as claimed in claim 11, further comprising a division processing section for grouping the target group displayed on said display in response to an instruction from said instruction inputting section and causing said display to divisionally display groups obtained by the grouping.

14. The path analyzing displaying apparatus as claimed in claim 11, further comprising an expansion processing section operable in response to an instruction from said instruction inputting section for causing said display to display a predetermined component as an analysis noticed element in addition to the target group on said display so that the predetermined component may be included into the target group.

15. The path analyzing displaying apparatus as claimed in claim 11, further comprising a deletion processing section operable in response to an instruction from said instruction inputting section for erasing a display of a predetermined component from the target group on said display so that the predetermined component may be included into the non-target group.

16. The path analyzing displaying apparatus as claimed in claim 11, further comprising a group unifying processing section operable in response to an instruction from said instruction inputting section for unifying a plurality of groups forming the target group on said display into a single group and causing said display to display the unified group.

* * * * *